Aug. 18, 1970 KENJI SEKIDO 3,525,043
APPARATUS FOR DIRECTLY VIEWING CURRENT-VOLTAGE CHARACTERISTICS
OF A SEMICONDUCTOR ELEMENT DRIVEN BY A MODULATED PULSE SUPPLY
Filed Feb. 18, 1969

INVENTOR.
Kenji Sekido
BY
Mann & Jangarathis
ATTORNEYS

United States Patent Office 3,525,043
Patented Aug. 18, 1970

3,525,043

APPARATUS FOR DIRECTLY VIEWING CURRENT-VOLTAGE CHARACTERISTICS OF A SEMICONDUCTOR ELEMENT DRIVEN BY A MODULATED PULSE SUPPLY

Kenji Sekido, Tokyo, Japan, assignor to Nippon Electric Company, Limited, Tokyo, Japan Filed Feb. 18, 1969, Ser. No. 800,147
Int. Cl. G01r *31/22*
U.S. Cl. 324—158 7 Claims

ABSTRACT OF THE DISCLOSURE

Oscilloscope apparatus for visually displaying a current-voltage characteristic curve of a semiconductor element whose crystal layer has a high power loss density when used in a state of high electric field intensity as a series of bright points, including voltage pulses representing the voltage applied to the element and current pulses representing the current flowing in the element in an in-phase relation, and brightness modulating voltage pulses synchronized with the in-phase voltage and current pulses, and uppermost flat portions of the brightness voltage pulses substantially coextensive with predetermined uppermost flat portions of the voltage and current pulses as applied to oscilloscope apparatus terminals to provide the characteristic curve bright points.

Figure 2:
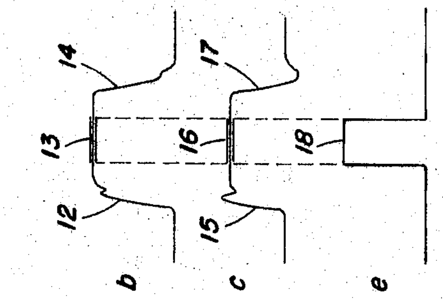

This invention relates to apparatus for visually displaying an electric characteristic curve of an electric device under measurement, and more specifically to such apparatus for visually displaying the characteristic curve as a series of bright points. The invention is particularly adaptable for visually displaying a current-voltage characteristic curve of a semiconductor element whose crystal layer has such amount of resistance as to cause high power loss density when used in a state of high electric field intensity.

A semiconductor element having a crystal layer has been heretofore developed for uses in which electrical active functions are obtained by applying a high electric field intensity to the crystal layer. One application of such semiconductor element is a solid state microwave oscillator utilizing the bulk negative resistance effect of an n-type GaAs semiconductor element. Another application of the high field intensity crystal layer semiconductor element is the IMPATT type solid-state microwave oscillator in which the electron avalanche in the p-n junction of a silicon semiconductor is utilized in combination with the transit time effect. The crystal forming each of these high field semiconductor elements provides a power loss density of relatively large magnitude in the portion which has the high electric field applied thereto. For example, a typical value of the power loss density in an n-type GaAs bulk oscillator element is as large as $10^7$ w./cm.$^3$.

When evaluating the acceptability of semiconductor elements having crystal layers used in a state of high field intensity, it is important to measure the voltage-current characteristic curve thereof at predetermined terminals of the semiconductor element as connected in a suitable measuring current. In the bulk oscillator semiconductor element of the n-type GaAs, for example, the low field resistance, voltage and current values at the initiation of oscillation, the status of current saturation and negative resistance in the oscillation voltage region, the current-voltage characteristic variation, and so forth, responsive to the polarity of the measuring voltage can be determined by measuring the current-voltage characteristic curve of such semiconductor element. Useful data may be thus obtained as regards the dynamic oscillation characteristic of a diode, as well as the quality of the electrodes used therein.

Several methods are heretofore known in the measuring art for observing the current-voltage characteristic curve of a semiconductor element, including: plotting at each measuring point; using an X–Y recorder; visually viewing a voltage-current characteristic curve via an oscilloscope having a cathode tube; and the like. Also, the well-known curve tracer has been previously employed for directly measuring the current-voltage characteristic curve of semiconductor junction diodes and transistors. This requres the application of a measuring voltage having a large duty cycle to the semiconductor element under test such, for example, as a non-smoothed voltage obtained via half-wave or full-wave rectification. It has been found that when the curve tracer is used for measuring the current-voltage characteristic curve of a semiconductor element having a large power loss density in its crystal, the effect of temperature rise in the semiconductor element becomes large. As a consequence, the measuring voltage applied to the semiconductor element under test results in an excessive temperature increase in the latter element and may cause permanent damage thereto. This is minimized to some extent by positioning a heat radiator in contact with the semiconductor element under test to control the rising temperature thereof and to hold it to a tolerable level at least.

This impairs the advantageous feature of the curve tracer, viz., the facile and expeditious measurements via a directly viewing device. In addition, the displayed voltage-current characteristic curve is subject to the adverse influence of the thermal hysteresis of the semiconductor element under test. As a consequence, a hysteresis loop is produced by the thermal effect in some cases. Also, because of such thermal limitation, it is difficult to measure the voltage-current characteristic curve under the condition where a measuring voltage increased above the normal operating level is applied to the semiconductor element under test. Furthermore, when the current-voltage characteristic curve of a semiconductor element intended for high power density use is measured, the element may be subjected to permanent damage due to a high duty cycle measuring voltage applied thereto even when a thermal radiator is positioned in contact with the element. As a consequence, it has been found that the above-noted disadvantage may be obviated by applying a square-wave voltage of low duty cycle pulse to the semiconductor element having a large power loss density in its crystal under test in order to observe a visually displayed curve representing the measured current-voltage characteristic of the latter element.

A visual display of a current-voltage characteristic curve of an electrical device under test by applying a measuring pulse thereto requires an automatic sweep from zero to a maximum value of the applied measuring voltage or current. The conventional sweep arrangement involves the use of a repetitive sawtooth pulse applied to an oscilloscope measuring apparatus for visually displaying a waveform on the oscilloscope screen as representing the relationship between the measuring pulse voltage applied to the device under test and the measuring pulse current flowing therethrough. According to this arrangement, the time variation of the pulse voltage becomes large when the measuring pulse width is narrowed for the purpose of lowering the duty cycle thereof. As a consequence, the accuracy of the current-voltage characteristic curve visually displayed on the oscilloscope screen is reduced as occasioned by the influence of a transient phenomenon caused by a parasitic reactance inherent in the measuring circuit in which the device under test is mounted. Also, according to the above-noted measuring arrangement, even if the effect of such undesirable phenomenon were reduced by widening the pulse width or by modifying the structure of the element mount, the brightness at the origin of the current-voltage characteristic curve visually displayed on the face of the cathode ray tube included in the oscilloscope apparatus becomes greater there than at any other point of the visually displayed characteristic curve. As a result, it is difficult to observe clearly and distinctly the current-voltage characteristic curve as displayed.

The present invention therefore contemplates an improved oscilloscope circuit for visually displaying a current-voltage characteristic curve of a semiconductor element characterized by a crystal having a large power loss density.

It is a principal object of the invention to provide an improved oscilloscope circuit for visually displaying an electric characteristic curve of an electric device under test.

Another object is to minimize the undesirable effect of heat due to power dissipation in a semiconductor element under test on the visual display of an electric characteristic curve thereof.

A further object is to reduce substantially the effect of an undesirable transient phenomenon based on the time variation of a measuring voltage or current applied to a semiconductor element under test on the visual display of an electric characteristic curve thereof.

An additional object is to eliminate the undesirable brightness at the point of origin of a visual display of an electric characteristic curve of a semiconductor element under test.

In a measuring circuit including an oscilloscope and a generator of measuring voltage for visually displaying a current-voltage characteristic of a semiconductor element having a crystal causing high power loss density, a specific embodiment of the present invention comprises the generator producing a square-wave voltage adjusted to produce a first output comprising a signal square-wave voltage having a predetermined frequency and amplitude modulated to a preselected amount by a modulating alternating voltage having a frequency less than the predetermined square-wave voltage frequency and a non-harmonic relation therewith, and a second output including a square-wave voltage having a constant amplitude and synchronized with the first square-wave voltage for deriving a brightness square-wave voltage synchronized with the signal square-wave voltage and having a constant amplitude, but a width less than the width of the latter voltage.

The signal square-wave voltage is applied to a network including the semiconductor element under test and an impedance means shunting the output end of the element to ground. Its input end may be shunted by a resistor also. The voltage produced across the resistor expresses the terminal voltage of the element under test. And the voltage across the impedance means expresses the current flowing in the element under test. Corresponding flat portions of the amplitude-modulated pulses having coextensive lengths and representing the terminal pulse voltage of the element under test and the pulse current flowing therethrough are applied to the respective voltage and current terminals of the oscilloscope under control of synchronized flat portions of the brightness pulse voltage having a length coextensive with the flat wave portions of the terminal voltage and current of the element to produce a current-voltage characteristic curve of the element under test as a series of bright points on the oscilloscope screen. The flat portions of the element terminal voltage and current and of the brightness voltage pulses are in-phase as applied to the oscilloscope terminals.

One feature of the invention resides in the use of measuring voltage pulses which are amplitude modulated to the order of 100%. Another feature involves the use of measuring voltage pulses having uppermost flat portions of constant width. An additional feature is that the frequency of a sine wave used for amplitude modulating the measuring voltage pulses has a non-harmonic relationship with the frequency of the latter pulses.

A further feature is that the use of the synchronized, corresponding uppermost flat portions of the several pulses applied to the oscilloscope obviates the undesirable influences of the rising and falling portions of the several pulse portions on the bright point current-voltage characteristic provided on the oscilloscope screen. Still another feature is the flat portions of the terminal voltage and current pulses of the element under test and the flat portions of the brightness pulses are substantially coextensive in length and in-phase as applied to the respective oscilloscope terminals.

Figure 1:
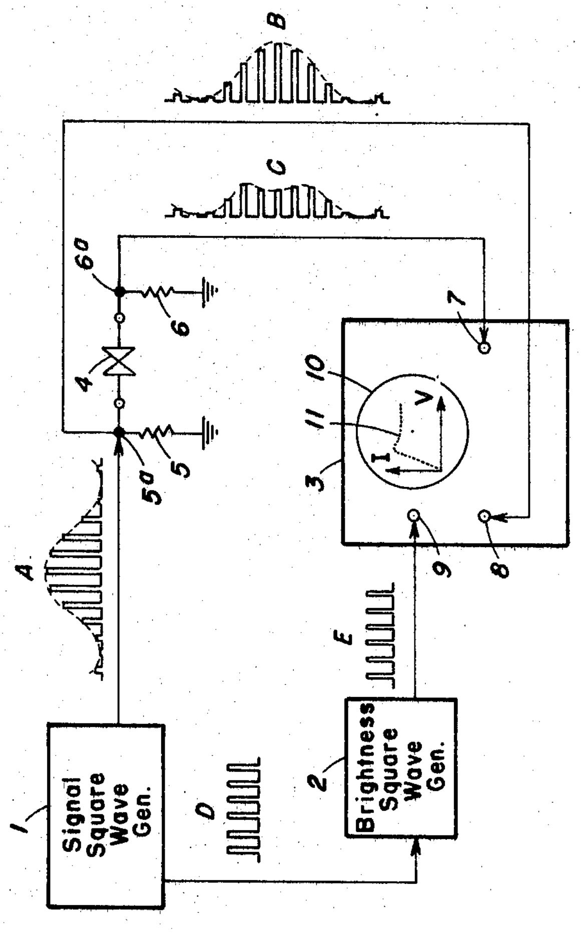

The invention is readily understood from the following description taken together with the accompanying drawing in which:

FIG. 1 is an oscilloscope measuring circuit including a specific embodiment of the present invention; and FIG. 2 is a family of curves obtainable in FIG. 1.

A generator 1 in FIG. 1 produces a first output including a signal square-wave pulse voltage A having a predetermined frequency and amplitude modulated to the order of 100% by a sine wave voltage having a frequency less than the predetermined frequency and a non-harmonic relation therewith, and a second output including a second square-wave pulse voltage D synchronized with the first square-wave pulse voltage A and having a constant amplitude. Voltage D activates a brightness square-wave generator 2 to produce a third square-wave pulse voltage E having a constant amplitude and a width which is less than the width of signal pulse A. Voltage E is also synchronized with voltage A. Other characteristics of brightness voltage E are further mentioned hereinafter. Oscilloscope 3 is activated to display visually a current-voltage curve of a semiconductor element under test in a manner that is hereinafter explained.

Signal square-wave voltage A is applied to a terminal *5a* which is common to one end of a resistor 5 whose opposite end is grounded. This resistor shunts to ground reactance in the circuit connection from the output of square-wave generator 1 to common terminal *5a*. A semiconductor element 4 embodying a crystal causing a large power loss density is connected between terminal *5a* and a terminal *6a* which is also joined to one end of a resistor 6 whose opposite end is grounded. It is thus seen that resistors 5 and 6 and the semiconductor element under test are connected in a pi-network. The terminal voltage V of the semiconductor element is expressed as the voltage produced across resistor 5. Resistor 6 connected in series with the semiconductor element detects current I flowing therein. The effective resistance value of resistor 6 is so preselected as to be small compared with the effective resistance value of the semiconductor element per se and is further so preselected that the voltage produced across resistor 6 is almost negligible in comparison with the voltage produced across resistor 5. It is therefore evident that the value of current flowing in the semiconductor element may be determined by dividing the voltage produced across resistor 6 by the resistance value thereof.

Current and voltage terminals *6a* and *5a* are connected to current and voltage terminals 7 and 8, respectively, of the oscilloscope. Thus, voltage pulses B representing the voltage pulses effective at the terminal of the semiconductor element are applied to an X-axis oscilloscope terminal 8 while current pulses C representing the current flowing in the semiconductor element are applied to a Y-axis oscilloscope terminal 7. It is assumed that the impedances of oscilloscope terminals 7 and 8 are of adequate magnitudes, and the frequency characteristics of the oscilloscope concerning the frequency bandwidths of the respective X and Y axis are sufficiently wide as to include the frequency component necessary for faithfully indicating the waveforms of voltage and current pulses B and C; respectively.

As previously mentioned, each brightness square-wave voltage pulse E has a constant amplitude and a width which is narrower than that of each pulse in square-wave pulses A, as well as in each of square-wave pulses B and C. In addition, the length of the flat portion of the top of each square-wave pulse E is included within the length of the flat portion of the top of each square-wave pulse A. Brightness square-wave pulses E are applied to oscilloscope brightness terminal 9.

FIG. 2 shows the positional relationship in time domain among pulses B, C and E as applied to the respective oscilloscope terminals in a sense as presently described. Individual pulse waveforms *b* and *c* of pulses B and C, respectively, take the corresponding positions on the time axis, i.e., the axis of abcissa. The top part 19 of waveform *e* corresponding to an individual pulse in brightness pulses E is substantially coextensive with the top flat portions 13 and 16 of waveforms *b* and *c*, respectively, and is in-phase therewith. As a consequence, the brightness in the waveform 11 displayed on oscilloscope screen 10 is visible only during the time corresponding to the top width 18 of pulses E and substantially invisible at other times. Therefore, the visible points of the analyzed voltage and current pulses as displayed on the oscilloscope screen correspond to the thickly shaded portions 13 and 16 of waveforms *b* and *c*, respectively.

It is clearly evident in displayed curve 11 that any undesirable influence of the transient phenomenon due to rise and fall portions 12 and 15 and 14 and 17, respectively, of pulses *b* and *c* does not appear in the latter displayed curve. Since pulses B and C have been subjected to 100% modulation, the voltages of flat portions 13 and 16 scan semi-continuously and periodically from zero to the maximum value. Thus, the current-voltage characteristic curve 11 of the semiconductor element under test is visually displayed, as a series of successive bright points on the oscilloscope screen.

In the operation of FIG. 1 as previously described, the relationship between the repetitive frequency $f_r$ of pulse A and the modulating repetitive frequency $f_m$ is expressed as $\alpha f_r = \beta f_m$ where $\alpha$ and $\beta$ are relatively simple integers. In other words, it is desirable that frequency $f_r$ should have a non-harmonic relationship with frequency $f_m$. The reason for this is that when such desirable relationship is established, the locations at which the successive bright points appear in curve 11 are varied with a lapse of time; and all loci of the displayed current-voltage characteristic curve are almost perfectly scanned by numerous discrete bright points in a short time, thereby clearly displaying the current-voltage characteristic curve on the oscilloscope screen. If, on the other hand, the measuring frequency $f_r$ were a higher harmonic of the modulating frequency $f_m$, the locations at which the bright points would appear would be fixed on the locus of th current-voltage characteristic curve and, as a consequence, the characteristic curve 11 would be displayed as a series of discontinuous points.

A sine wave voltage is employed as the signal for modulating the amplitude of measuring voltage A applied to the semiconductor element under test in FIG 1. It is obvious that a sawtooth modulating voltage may also be used with favorable results. When a sine wave is used as the modulating signal, the density of the bright points in intermediate portions of the voltage and current becomes somewhat lower than in the end portions thereof. Whereas, in the case of a sawtooth modulating voltage the bright point density on the current-voltage curve is more uniform than when the sine wave is utilized. In addition, it is noted that while a 100% modulation is used in FIG. 1, a slight increase in excess of 100% would not materially impair the operation of the measuring circuit.

It is also noted in FIG. 1 that a pi-type resistance circuit including resistors 5 and 6 having the semiconductor element under test connected between corresponding terminals thereof is used as a pulse generator circuit which represents the terminal voltage and current of such element corresponding to the amplitude modulated repetitive voltage pulse A applied thereto. Instead of the pi-type resistance circuit, it is feasible to use, for example, a circuit in which a magnetic field produced by the current flowing in the semiconductor element under test is detected by utilizing the Hall effect of the semiconductor element, thereby obtaining the pulses representing the current flowing in the latter element. In this case, the pulses representing the current and voltage of the semiconductor element under test should be in-phase as illustrated via waveforms *b* and *c* in FIG. 2 .

The effect of delay time inherent in the propagation of the various pulses over their transmission leads has not been described. In most cases, however, such effect can be neglected. In view of the fact that the time relationship between waveforms *b*, *c* and *e* in FIG. 2 is established only at the instant when the pulses are applied to the respective terminals of the oscilloscope, it is possible to avoid the influence of the delay time effect upon the normal operation of FIG. 1 by only removing time delay in the oscilloscope per se.

The invention as illustrated in FIGS. 1 and 2 utilizes repetitive pulses having flat portions and subjected to at least 100% amplitude modulation as the measuring voltage applied to a semiconductor element under test in order to avoid excessive temperature rise in the latter element and extracts only the flat portions of the voltage and current pulses representing the terminal voltage of the element under test and the current flowing therein for display as the current-voltage characteristic curve of the element on the oscilloscope screen under control of synchronized flat portions of a brightness voltage.

While the invention has been hereinbefore explained with reference to a specific embodiment for the purpose of this description, it should be clearly understood that the invention is not restricted to such embodiment but that it is possible to carry out various modifications by those skilled in the art without departing from the spirit and scope of the invention.

What is claimed is:

1. Apparatus for visually displaying a current-voltage characteristic curve of a semiconductor element having inherent resistance causing power loss in response to a measuring voltage, comprising:

pulse generating means for producing first voltage pulses having a predetermined frequency and amplitude modulated to a preselected amount by a modulating wave having a frequency less than said predetermined frequency and a non-harmonic relation therewith; said means also simultaneously producing brightness voltage pulses having said predetermined frequency and a preselected width;

a network having first and second terminals connected to opposite terminals of said element, at least said second terminal being connected to ground through an impedance element;

circuit means for applying said amplitude modulated pulses to said network first terminal for enabling production of amplitude modulated terminal voltage pulses at said element first terminal as expressed by amplitude modulated voltage pulses and for developing a flow of amplitude modulated current pulses in said impedance element as representing amplitude modulated current pulses flowing in said element; said amplitude modulated terminal voltage pulses applied to said element first terminal reducing the power loss in said element, and oscilloscope means for receiving preselected in-phase flat portions of said element terminal pulses, said element current pulses and said brightness pulses to visually produce a current-voltage characteristic curve of said element as a series of bright points.

2. The apparatus according to claim 1 in which said preselected amount of amplitude modulation of said first voltage pulses is not less than 100 percent.

3. The apparatus according to claim 1 in which said preselected width of each of said brightness voltage pulses is narrower than the width of each of said amplitude modulated first voltage pulses.

4. The apparatus according to claim 1 in which said pulse generating means produces other voltage pulses synchronized with said amplitude modulated first voltage pulses, and includes means activated by said last-mentioned other voltage pulses to produce said brightness voltage pulses.

5. The apparatus according to claim 1 in which said impedance means is provided with a preselected small resistance value compared with the resistance value of said semiconductor element; and said impedance means is further provided with said preselected small resistance value to produce thereacross voltage pulses which are substantially negligible compared with the voltage pulses produced across said element.

6. The apparatus according to claim 1 in which said preselected in-phase flat portions of said voltage, current and brightness pulses comprise uppermost flat portions which are substantially coextensive in corresponding planes.

7. Apparatus for visually displaying a current-voltage characteristic of a semiconductor element embodying inherent resistance causing power loss in response to a measuring voltage, comprising:

pulse generating means for producing first voltage pulses having a predetermined frequency and amplitude modulated to not less than of 100 percent by a modulating sine wave having a frequency less than said predetermined frequency and a non-harmonic relation therewith; said means also simultaneously producing brightness voltage pulses having said predetermined frequency and a preselected width; said last-mentioned width of each of said brightness pulses being narrower than the width of each of said first amplitude modulated pulses;

a four terminal resistance network having first and second terminals connected to ground and third and fourth terminals connected to opposite terminals of said element; said network including a first resistor connected between said first and third terminals and a second resistor connected between said second and fourth terminals; said second resistor provided with a preselected small resistance value compared with the resistance value of said element; said second resistor further provided with said preselected resistance value to produce thereacross voltage pulses whose magnitude is substantially negligible compared with the magnitude of the voltage pulses produced across said first resistor;

circuit means for applying said amplitude modulated pulses to said network third terminal for enabling a production of amplitude modulated terminal voltage pulses at said element third terminal as expressed by the amplitude modulated voltage pulses produced across said first resistor and for developing a flow of amplitude modulated current in said second resistor as representing amplitude modulated current pulses flowing in said element, said first resistor shunting said inherent reactance to ground, said amplitude modulated voltage pulses applied to said element third terminal reducing the power loss in said element;

and oscilloscope means for receiving in-phase and coextensive uppermost flat portions of said element amplitude modulated terminal voltage pulses and current pulses and of said brightness voltage pulses in corresponding planes to visually produce a current-voltage characteristic trace of said element as a series of bright points.

References Cited

UNITED STATES PATENTS 3,104,343 9/1963 McGrogan ------ 324—158 XR

RUDOLPH V. ROLINEC, Primary Examiner

E. L. STOLARUN, Assistant Examiner

U.S. Cl. X.R.

324—121